(12) United States Patent
Van Der Zanden (10) Patent No.: US 12,206,371 B2
(45) Date of Patent: Jan. 21, 2025

(54) POWER AMPLIFIER DEVICE AND SEMICONDUCTOR DIE

(71) Applicant: Ampleon Netherlands B.V., Nijmegen (NL)

(72) Inventor: Josephus Henricus Bartholomeus Van Der Zanden, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 536 days.

(21) Appl. No.: 17/554,741

(22) Filed: Dec. 17, 2021

(65) Prior Publication Data

US 2022/0200550 A1     Jun. 23, 2022

(30) Foreign Application Priority Data

Dec. 17, 2020    (NL) ...................................... 2027145

(51) Int. Cl.
    *H03F 3/14*          (2006.01)
    *H01L 23/495*      (2006.01)
    (Continued)

(52) U.S. Cl.
    CPC ......... *H03F 3/213* (2013.01); *H01L 23/4952* (2013.01); *H01L 23/49562* (2013.01);
    (Continued)

(58) Field of Classification Search
    CPC .... H03F 3/213; H03F 2200/451; H03F 1/565; H03F 3/195; H03F 3/14; H03F 3/187;
    (Continued)

(56) References Cited

U.S. PATENT DOCUMENTS 7,986,184 B2 *   7/2011   Besling .................. H01L 28/92
                                                     330/307
9,401,682 B2 *   7/2016   Blednov ................. H03F 3/245
                      (Continued)

FOREIGN PATENT DOCUMENTS

WO     2006097893 A2    9/2016
WO     2019202631 A1   10/2019

OTHER PUBLICATIONS

International Search Report and Written Opinion, Application No. NL2027145, dated Aug. 18, 2021, 11 pages (English translation included).

*Primary Examiner* — Khanh V Nguyen
(74) *Attorney, Agent, or Firm* — McDonnell Boehnen Hulbert & Berghoff LLP (57) ABSTRACT

Example embodiments relate to power amplifier devices and semiconductor dies. One example power amplifier device includes a semiconductor die having a first input terminal and a first output terminal. The power amplifier device also includes a power transistor integrated on the semiconductor die and including a second input terminal and a second output terminal arranged at an input side and output side of the power transistor, respectively. The power transistor has an output capacitance. Further, the power amplifier device includes a shunt network that includes a plurality of first bondwires arranged in series with a first capacitor. The first capacitor is arranged near the input side of the power transistor. At one end of the shunt network one end of the plurality of first bondwires is coupled to the second output terminal. Additionally, the power amplifier includes a pair of coupled lines formed on the semiconductor die.

20 Claims, 9 Drawing Sheets

(51) Int. Cl.
*H01L 23/66* (2006.01)
*H03F 3/213* (2006.01)

(52) U.S. Cl.
CPC ........ *H01L 23/49589* (2013.01); *H01L 23/66* (2013.01); *H01L 2223/6655* (2013.01); *H03F 2200/451* (2013.01)

(58) Field of Classification Search
CPC .......... H01L 23/4952; H01L 23/49562; H01L 23/49589; H01L 23/66; H01L 2223/6655; H01L 24/48; H01L 24/49; H01L 2223/6611; H01L 2224/45099; H01L 2224/48132; H01L 2224/49175; H01L 2224/73265; H01L 2924/1421; H01L 2224/48137; H01L 2224/48247; H01L 25/16; H01L 23/49503; H01L 23/49548; H01L 23/49575; H01L 2924/3011
See application file for complete search history.

(56) References Cited

U.S. PATENT DOCUMENTS

| | | | |
|---|---|---|---|
| 10,541,653 B2 * | 1/2020 | Zhu | H03F 1/565 |
| 2008/0246547 A1 * | 10/2008 | Blednov | H03F 3/195 29/601 |
| 2009/0096068 A1 | 4/2009 | Sjoestroem | |
| 2011/0148529 A1 | 6/2011 | Besling et al. | |

* cited by examiner

POWER AMPLIFIER DEVICE AND SEMICONDUCTOR DIE

CROSS-REFERENCE TO RELATED APPLICATIONS

The present application is a non-provisional patent application claiming priority to Netherlands Patent Application No. NL 2027145, filed Dec. 17, 2020, the contents of which are hereby incorporated by reference.

FIELD OF THE DISCLOSURE

The present invention relates to a power amplifier device. The present invention further relates to a semiconductor die used or to be used in such a power amplifier device. The present invention particularly relates to power amplifier devices operable at radiofrequency, RF, frequencies, more in particular in a frequency range between 100 MHz and 40 GHz. More in particular, the present invention relates to power amplifier devices comprising one or more laterally diffused metal-oxide-semiconductor (LDMOS) transistors as power transistors outputting power levels of 20 W and higher although the present invention may be equally applied with other transistor technologies such as gallium nitride field-effect transistors.

BACKGROUND

Figure 1A:
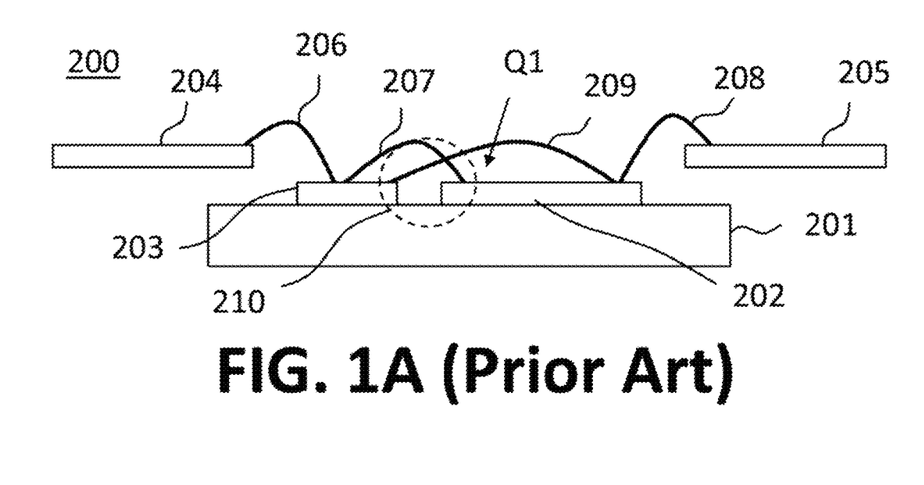
FIG. 1A illustrates a cross-sectional view of a power amplifier device, according to the prior art.
Figure 1B:
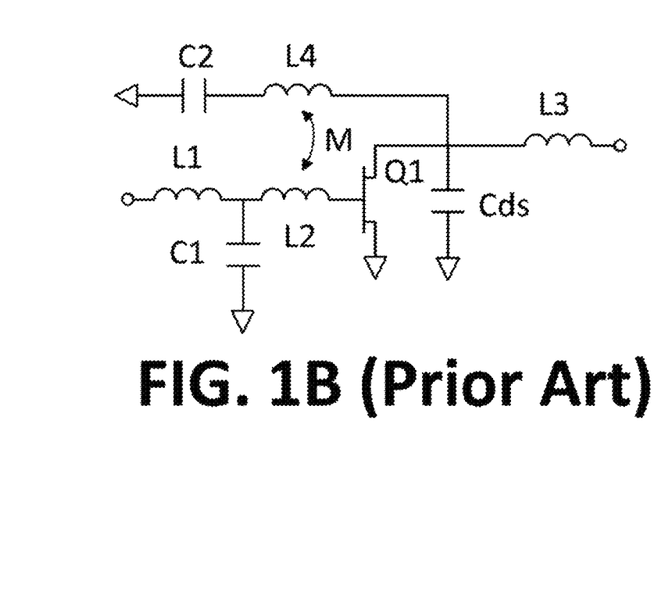
FIG. 1B illustrates an electrical equivalent circuit of a power amplifier device, according to the prior art.

FIGS. 1A and 1B show an exemplary power amplifier device 200 known from WO2006097893A2. The cross sectional view of FIG. 1A illustrates a conductive substrate 201 on which an active semiconductor die 202 is mounted as well as a passive semiconductor die 203. Power amplifier device 200 further comprises input leads 204 and output leads 205. At least one input lead 204 is connected to passive semiconductor die 203 using bondwires 206. More in particular, bondwires 206 connect an input lead 204 to a non-grounded terminal of a capacitor arranged on passive semiconductor die 203. In the equivalent electrical circuit shown in FIG. 1B, the capacitor is indicated as C1 and bondwires 206 as inductor L1.

The other terminal of C1 is electrically grounded at least during use. Bondwires 207, represented by inductor L2 in FIG. 1B, connect the non-grounded terminal of C1 to the gate of power transistor Q1 which is arranged on active semiconductor die 202. Power transistor Q1 has an output capacitance, which in FIG. 1B is represented by capacitor Cds.

The drain of power transistor Q1 is connected to one or more output leads 205 using bondwires 208, which are represented by inductor L3 in FIG. 1B. In addition, the drain of power transistor Q1 is connected using a shunt network to ground. This shunt network comprises bondwires 209 that are arranged in series with a capacitor C2, which is equally arranged on passive semiconductor die 203. In FIG. 1B, bondwires 209 are modelled by inductor L4.

At or close to an operational frequency of the power amplifier device the shunt network resonates with Cds such that the impact of the output capacitance on RF performance can be mitigated.

As can be seen in FIG. 1A, bondwires 207 and 209 show a particular overlap, which in FIG. 1A is visualized using dashed circle 210. Due to this overlap, bondwires 207 and 209, and therefore inductors L2 and L4, are inductively coupled. This is illustrated in FIG. 1B using a coefficient of mutual induction M.

Power transistor Q1 comprises feedback capacitance, more in particular a gate-drain capacitance, coupling output to input. Such feedback can be detrimental to the stability of power transistor Q1 or the circuit it forms part of. According to WO2006097893A2, by varying the overlap between bondwires 207 and 209, the negative impact of the feedback capacitance on stability can be mitigated.

The Applicant has found that the solution offered by WO2006097893A2, does not allow sufficient mitigation of the feedback capacitance for current and future applications, in particular for LDMOS devices operating above 1 GHz at power levels of 100 W.

SUMMARY

An object of the present invention is to provide a power amplifier device that allows for better mitigation of the impact of the feedback capacitance on stability of the power amplifier device.

This object has been achieved using the power amplifier device as defined by claim 1, which comprises a semiconductor die having a first input terminal and a first output terminal, and a power transistor integrated on the semiconductor die that comprises a second input terminal and a second output terminal arranged at an input side and output side of the power transistor, respectively. The power transistor has a particular output capacitance.

The power amplifier device further comprises a shunt network comprising a plurality of first bondwires arranged in series with a first capacitor that is arranged near the input side of the power transistor and wherein at one end of the shunt network one end of the plurality of first bondwires is coupled to the second output terminal, wherein an other end of the shunt network is, at least during use, electrically grounded.

An inductance associated with the plurality of first bondwires and a capacitance associated with the first capacitor is such that at or close to an operational frequency of the power amplifier device the shunt network resonates with the output capacitance. For example, the power amplifier may be configured to operate within the frequency band from 1.8 GHz to 2.2 GHz. In this case, the resonance of the shunt network and the output capacitance may occur at a frequency within this band or at a frequency close to this band.

According to the present invention, the power amplifier device is characterized in that it further comprises a pair of coupled lines formed on the semiconductor die, wherein a first line of the pair of coupled lines is connected in series between the first input terminal and the second input terminal, and wherein a second line of the pair of coupled lines is incorporated in the shunt network in series with the first plurality of bondwires and the first capacitor.

The Applicant has found that by using coupled lines, a better control over the stability of the power amplifier device can be obtained. Without being bound by theory, this improved control can be attributed to an increased capacitive coupling when compared to bondwires 207, 209, which were only inductively coupled. In addition, the improved control can be attributed to the localization in space where the coupling occurs. The Applicant has found that varying the overlap in the known device shown in FIG. 1A not only affects stability but also other parameters of the power amplifier device. This is mainly because bondwires 207, 209 act as antennas not only coupling to each other but also to other parts of the power amplifier device. Using coupled lines as described by the present disclosure, the coupling is more confined in space.

The semiconductor die may comprise a metal layer stack comprising a plurality of metal layers, wherein the pair of coupled lines is formed on different metal layers in the metal layer stack, the pair of coupled lines having at least a partial lateral overlap. A metal layer stack in contemporary transistor processes may comprise 6 or more metal layers, wherein the higher metal layers, i.e. those layers that are located at a greater distance from the semiconductor surface, are thicker than the lower metal layers thereby offering a lower Ohmic resistance.

The pair of coupled lines is preferably formed in the upper layers of the metal layer stack, and more preferably in vertically adjacent metal layers. These lines may have an equal width and may be positioned directly above each other. In other embodiments, the lines may have been mutually shifted in a lateral direction such that the overlap between the lines is only partial. In general, such coupling is referred to as broadside coupling.

The present invention may however be equally applied using edge coupled lines. In such case, the lines may be arranged on a same metal layer spaced apart in the lateral direction. For both the edge coupled and broadside coupled lines, the lines are preferably arranged in parallel.

The first capacitor may comprise a first and second terminal, and the first line of the pair of coupled lines may comprise a first end connected to the first input terminal and a second end connected to the second input terminal. The second line of the pair of coupled lines may comprise a third end connected to an other end of the plurality of first bondwires and a fourth end connected to the first terminal of the first capacitor, the second terminal of the first capacitor being electrically grounded at least during use. Alternatively, the second line of the pair of coupled lines may comprise a third end connected to the second terminal of the first capacitor and a fourth end that is electrically grounded at least during use, the first terminal of the first capacitor being connected to said an other end of the first plurality of bondwires. Hence, the second line may be arranged in between ground and the first capacitor, or it may be arranged in between the first bondwires and the first capacitor.

The first end may be arranged closer to the third end than to the fourth end, and the second may be arranged closer to the fourth end than to the third end. The arrangement of the first, second, third, and fourth ends is important as this determines the sign of the inductive coupling between the first and second lines.

The first and second lines of the pair of coupled lines are preferably formed by respective straight line segments. Such line segments may be of any suitable transmission line type, such as a microstrip line type, coplanar type, or stripline type.

The pair of coupled lines and the first capacitor can be implemented in a distributed manner. For example, the semiconductor die may comprise a plurality of first unit cells, each first unit cell comprising a first capacitor segment, a first line segment extending between a first line segment input and a first line segment output, a bondpad coupled to the second output terminal using one or more first bondwires, and a second line segment of which at least a part forms a respective pair of coupled line segments with at least a part of the first line segment.

The first unit cell also comprises a first connecting segment connecting the bondpad to an end of the second line segment, and a second connecting segment connecting an other end of the second line segment to the first capacitor segment. Alternatively, the first unit cell also comprises a first connecting segment connecting an end of the second line segment to the first capacitor segment, and a second connecting segment connecting an other end of the second line segment to ground at least during use. In this latter case, the first capacitor segment is arranged in series between the second line segment and the bondpad.

In both cases, the first capacitor is formed by the plurality of first capacitor segments, and the pair of coupled lines is formed by the plurality of pairs of coupled line segments.

The semiconductor die may further comprise a first connecting bar to which the first line segment inputs are connected. This first connecting bar is connected to or at least partially forms the first input terminal. Additionally, or alternatively, the semiconductor die may further comprise a second connecting bar to which the first line segment outputs are connected. This second connecting bar is connected to or at least partially forms the second input terminal. The first capacitor segments may be arranged in a space between the bondpad and the second connecting bar.

In some embodiments, a part of each first line segment does not laterally overlap with a respective second line segment. Such part may be shielded, for example by using a higher metal layer that overlaps this part. Additionally, or alternatively, a lower lying metal layer may be used for controlling the return currents.

The semiconductor die may further comprise a plurality of second unit cells, each second unit cell being a mirrored copy of a respective first unit cell. Additionally, or alternatively, the first unit cells are identical and the second unit cells are identical. In a particular embodiment, the first and second unit cells are alternately arranged such that either the first line segments and/or second line segments of adjacent first and second unit cells abut each other or such that the bondpad and/or the first or second connecting elements of adjacent first and second unit cells abut each other. In this manner, a new unit cell is formed comprising a first unit cell and a mirror copied thereof in abutment. These new unit cells are arranged in abutment on the semiconductor die.

The semiconductor die may further comprise a plurality of input fingers that are each coupled to the second input terminal and a plurality of output fingers that are each coupled to the second output terminal, wherein the second output terminal at least partially forms the first output terminal or is connected to the first output terminal through an impedance matching stage. In some embodiment, the first output terminal equals the second output terminal. Additionally, or alternatively, in some embodiments, the bondpad of the first and/or second unit cell is connected to the first output terminal instead of the second output terminal.

The power transistor may comprise a field-effect transistor (FET), such as a gallium nitride based FET or a silicon based LDMOS. In such case, the input fingers are gate fingers and the output fingers are drain fingers. The source contacts of these FETs are typically grounded during use. Such grounding can be achieved by means of vias that extend through the semiconductor die or by means of having a conductive semiconductor substrate for the semiconductor die.

The first output terminal and the first input terminal can be each formed by a bondbar or by a plurality of bondpads allowing them to be connected to using bondwires.

The power amplifier device may further comprise a power amplifier output connected to the first output terminal using a plurality of second bondwires. In addition, the power amplifier device may further comprise a power amplifier input that is connected to the first input terminal directly using a plurality of third bondwires or that is connected to the first input terminal through one or more impedance matching stages of which a last impedance matching stage is connected to the first input terminal using a plurality of third bondwires.

The power amplifier device may further comprise a conductive substrate, such as a diepad, flange, or heatsink, and one or more input leads or pads and one or more output leads or pads that are separated from the conductive substrate, wherein the semiconductor die is mounted on the conductive substrate, and wherein at least one input lead or pad forms the power amplifier input and wherein at least one output lead or pad forms the power amplifier output. The power amplifier device may be a packaged power amplifier device for example using a leadframe based package.

According to a second aspect, the present invention also provides a semiconductor die configured to be used as the semiconductor die of the power amplifier described above.

BRIEF DESCRIPTION OF THE DRAWINGS

Next, the present invention will be described in more detail referring to the appended drawings, wherein.

DETAILED DESCRIPTION

In the following detailed description, identical reference signs will be used to refer to identical or similar components. In addition, when referring to electrical components, a symbol, e.g. L1, may be used to refer to that component as such or may refer to an electrical parameter of that component, e.g. such as its inductance.

Figure 2A:
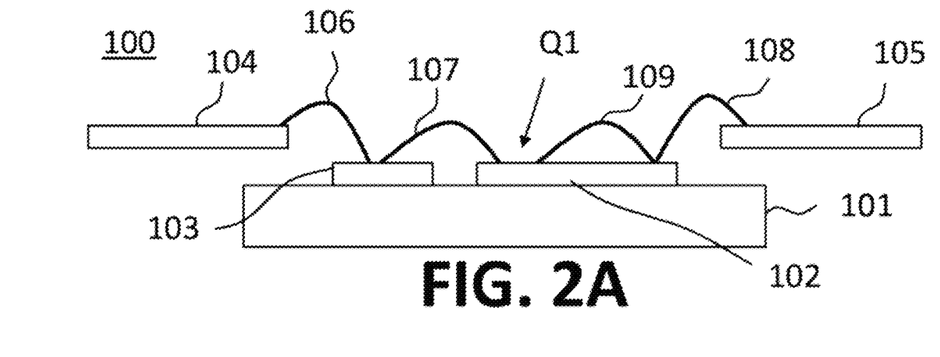
FIG. 2A illustrates a cross-sectional view of a power amplifier device, according to example embodiments.
Figure 2B:
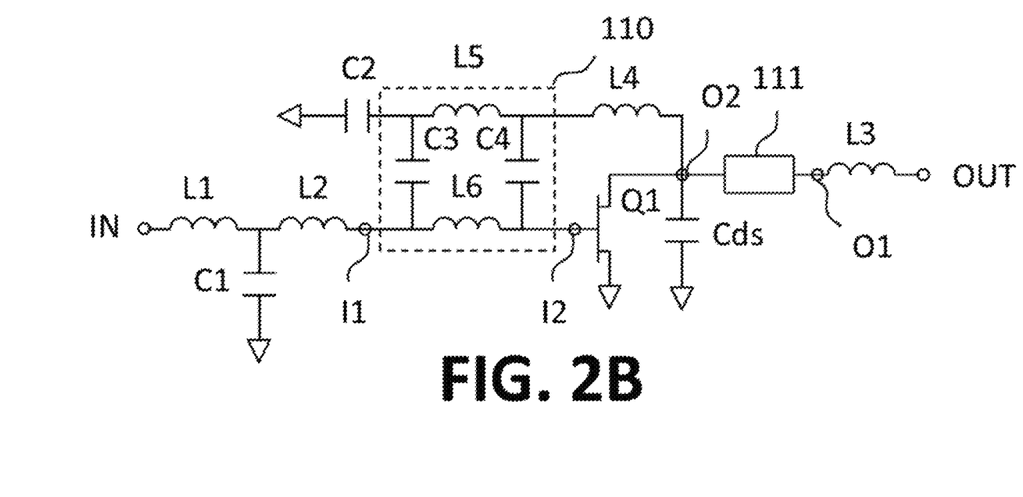
FIG. 2B illustrates an electrical equivalent circuit of a power amplifier device, according to example embodiments.

FIGS. 2A and 2B illustrate a cross sectional view and an electrical equivalent circuit of a power amplifier device 100 in accordance with the present invention, respectively.

The cross-sectional view of FIG. 2A illustrates a conductive substrate 101 on which an active semiconductor die 102 is mounted as well as a passive semiconductor die 103. Power amplifier device 100 further comprises input leads 104 and output leads 105. At least one input lead 104 is connected to passive semiconductor die 103 using bondwires 106. More in particular, bondwires 106 connect an input lead 104 to a non-grounded terminal of a capacitor arranged on passive semiconductor die 103. In the electrical circuit shown in FIG. 2B, the capacitor is indicated as C1 and bondwires 106 as inductor L1.

The other terminal C1 is electrically grounded at least during use. Bondwires 107, represented by inductor L2 in FIG. 2B, connect the non-grounded terminal of C1 to the gate of power transistor Q1 which is arranged on active semiconductor die 102. Power transistor Q1 has an output capacitance, which in FIG. 2B is represented by capacitor Cds.

Figure 3:
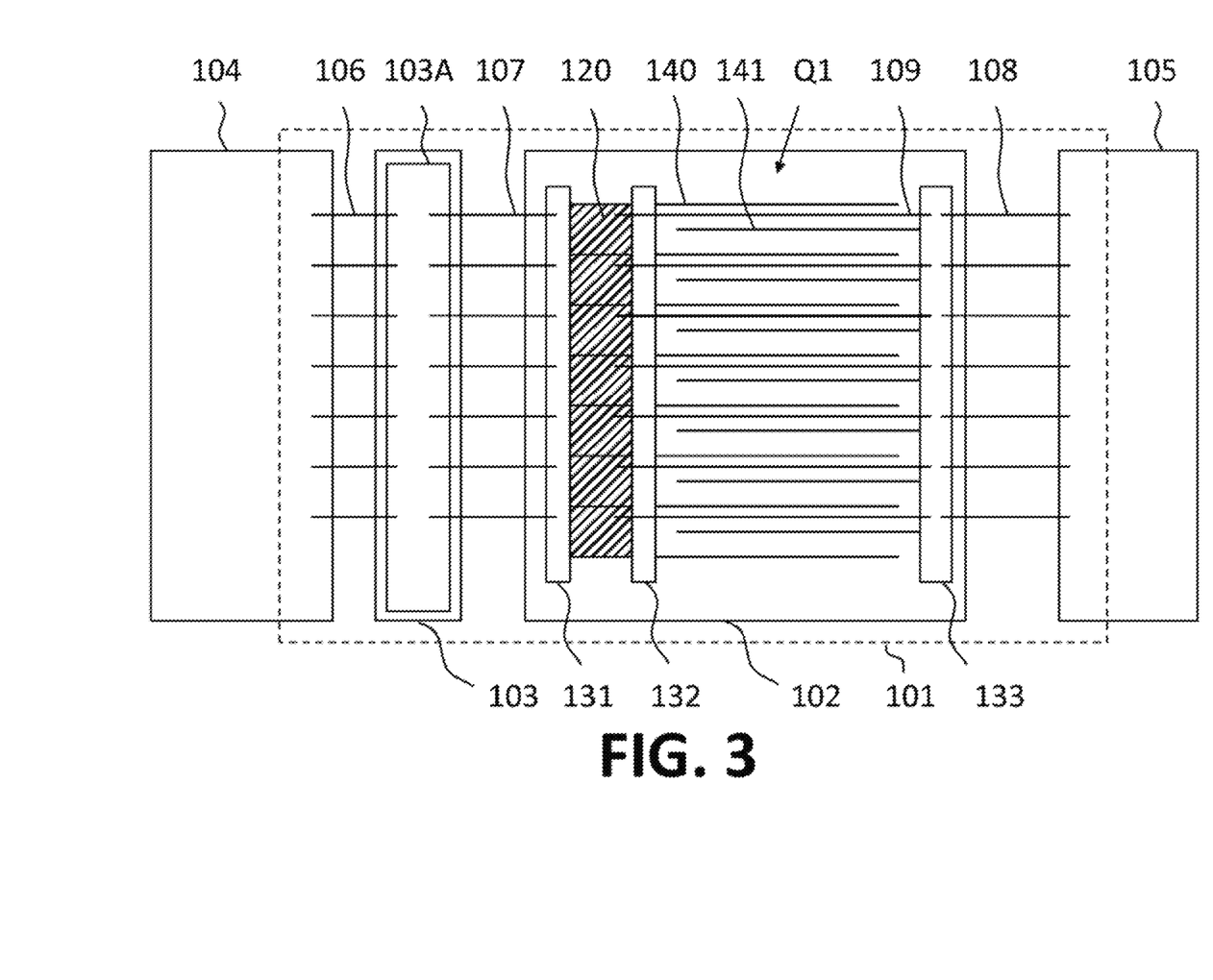
FIG. 3 illustrates a top view of a power amplifier device, according to example embodiments.

The drain of power transistor Q1 is connected to one or more output leads 105 using bondwires 108, which are represented by inductor L3 in FIG. 2B. In addition, the drain of power transistor Q1 is connected using a shunt network to ground. This shunt network comprises a plurality of bondwires 109 (as illustrated in FIG. 3) that are arranged in series with a capacitor C2, which is arranged on active semiconductor die 102. In FIG. 2B, bondwires 109 are modelled by inductor L4.

Semiconductor die 102 comprises a pair of coupled lines 110. In FIG. 2B, coupled lines 110 are represented by the network L5, L6, C3 and C4. Depending on size and geometry, L5 may be equal to L6 and C3 may be equal to C4. At or close to an operational frequency the shunt network resonates with Cds such that the impact of the output capacitance on RF performance can be mitigated. In addition, additional inductances (not shown) may be provided in between C2 and L5, in between L5 and L4, in between L2 and L6, and/or in between L6 and the gate of Q1. These inductances are not part of the pair of coupled lines 110 and represent the inductances associated with connecting the pair of coupled lines 110 to other parts of the circuit.

Power amplifier device comprises a first input terminal I1, a second input terminal I2, a first output terminal O1, and a second output terminal O2, which are all arranged on active semiconductor die 102. In addition, power amplifier device comprises a power amplifier output OUT and a power amplifier input IN. In between output terminals O1 and O2 an optional impedance output matching network 111 may be provided.

FIG. 3 illustrates a top view of a power amplifier device 100 in accordance with the present invention. Here, it is illustrated that passive semiconductor die 103 comprises a capacitor C1 of which a first terminal is formed by a bondbar 103A although a plurality of interconnected bondpads could equally have been used. The second terminal of C1 is electrically grounded, at least during use. Within the context of the present invention, electrically grounded should be interpreted as being connected to electrical ground when the power amplifier device is normally used. For example, power amplifier device 100 is normally used in applications in which conductive substrate 101 is mounted to a ground pad of a printed circuit board on which power amplifier device 100 is mounted. Furthermore, passive semiconductor die 103 may be electrically conductive or may comprise vias for connecting the second terminal of C1 to ground via conductive substrate 101.

Figure 4A:
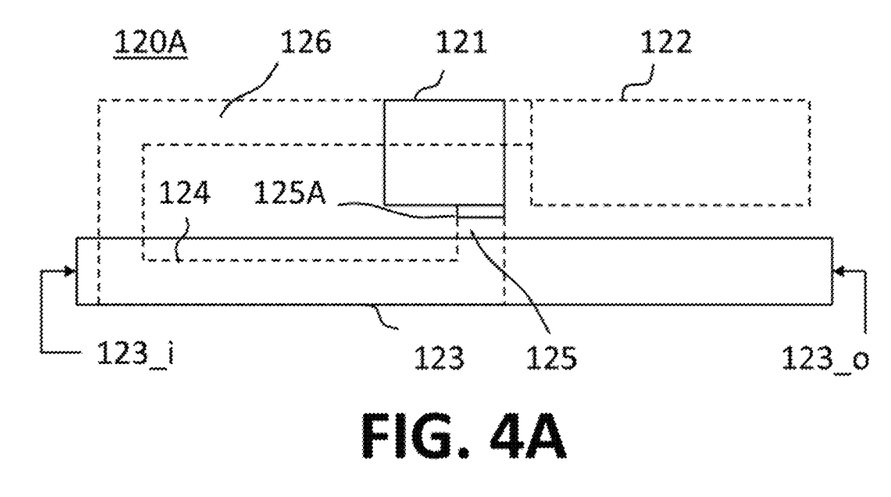
FIG. 4A illustrates a unit cell to be used in the power amplifier device shown in FIG. 3, according to example embodiments.
Figure 4B:
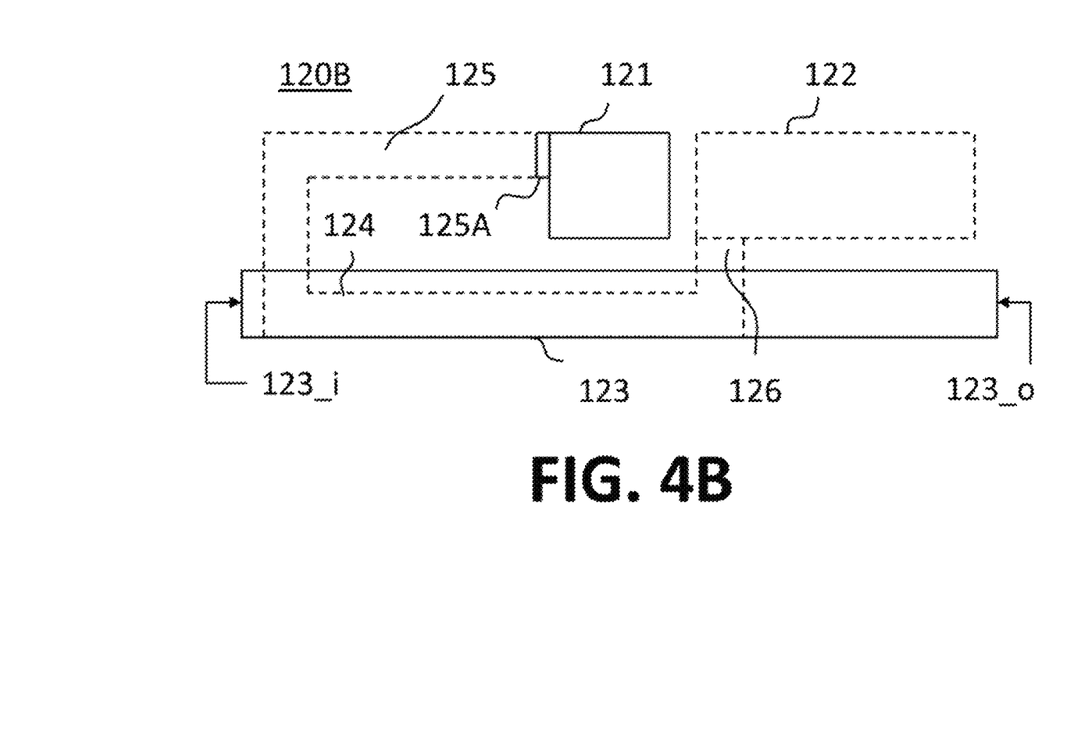
FIG. 4B illustrates a unit cell to be used in the power amplifier device shown in FIG. 3, according to example embodiments.
Figure 4C:
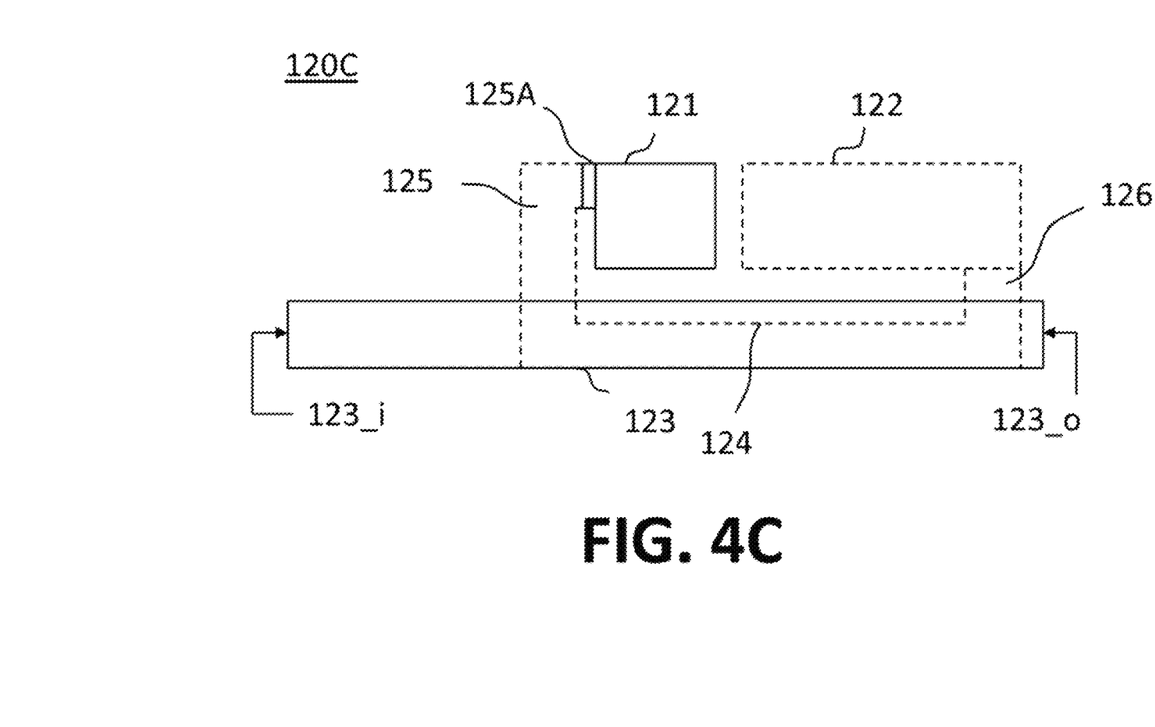
FIG. 4C illustrates a unit cell to be used in the power amplifier device shown in FIG. 3, according to example embodiments.
Figure 4D:
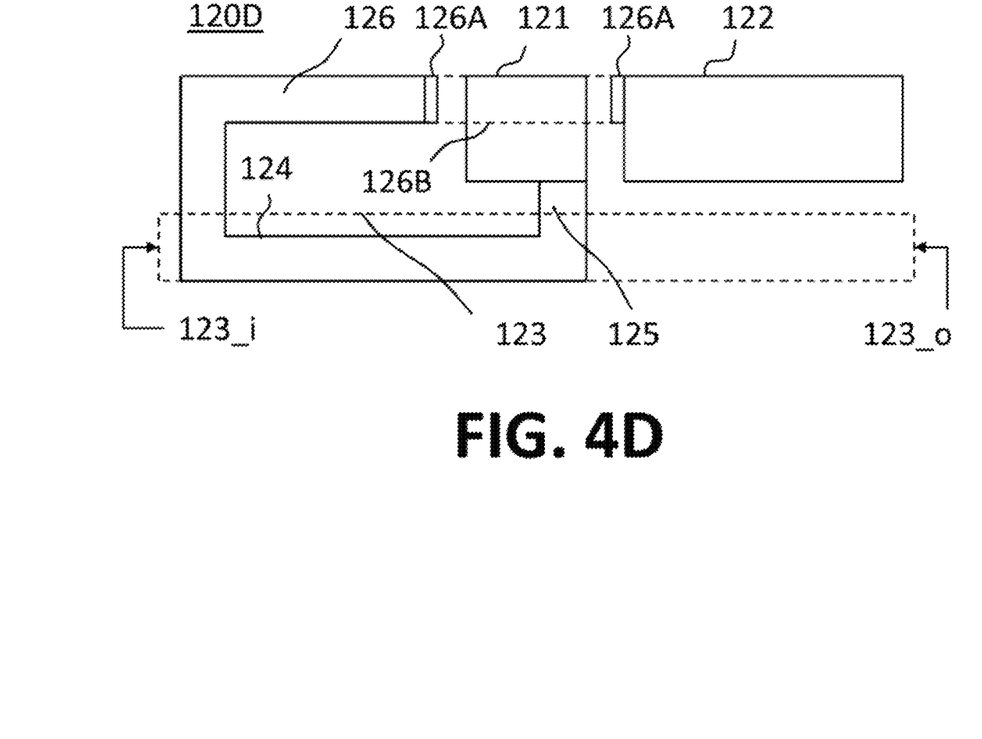
FIG. 4D illustrates a unit cell to be used in the power amplifier device shown in FIG. 3, according to example embodiments.

Also visible in FIG. 3 are connecting bars 131 and 132 in between which a plurality of unit cells 120 are arranged of which examples are shown in FIGS. 4A and 4B. Here, connecting bar 131, configured as a bondbar, forms first input terminal I1 of FIG. 2B. Connecting bar 132 forms second input terminal I2 shown in FIG. 2B. Similarly, connecting bar 133, configured as a bondbar, forms second output terminal O2. Because no further matching circuitry is arranged on active semiconductor die 102, connecting bar 133 also forms first output terminal O1.

Power transistor Q1 is an LDMOS transistor comprising a plurality of gate fingers 140 connected to connecting bar 132 and a plurality of drain fingers 141 connected to connecting bar 133.

FIGS. 4A-4D illustrate four examples 120A, 120B, 120C, 120D of a unit cell in accordance with the present invention. Each unit cell 120A, 120B, 120C, 120D comprises a first line segment 123 that extends between a first line segment input 123_i and a first line segment output 123_o, and a second line segment 124 that forms a pair of coupled lines together with a part of first line segment 123. Unit cells 120A, 120B, 120C, 120D further each comprise a bondpad 121 for receiving a bondwire 109 and a first capacitor segment of which the non-grounded terminal is indicated by reference sign 122.

Unit cells 120A, 120B, 120C, 120D differ in the way that second line segment 124 is connected to bondpad 121. More in particular, in FIG. 4A, bondpad 121 and first line segment 123 are indicated using solid lines and are both arranged in a higher metal layer than second line segment 124 and non-grounded terminal 122, which are both indicated using dashed lines. On the other hand, in FIG. 4D, bondpad 121 and second line segment 124 are both arranged in a higher metal layer than first line segment 123. This requires an underpass underneath bondpad 121 for the connection between second line segment 124 and non-grounded terminal 122. This underpass is formed using a line segment 126B which is arranged on a lower lying metal layer than line segment 126. This latter lower lying metal layer could be the same metal layer as the metal layer on which line segment 123 is arranged. Connection between the higher lying and lower lying metal layers is realized using vias 126A.

Figure 5A:
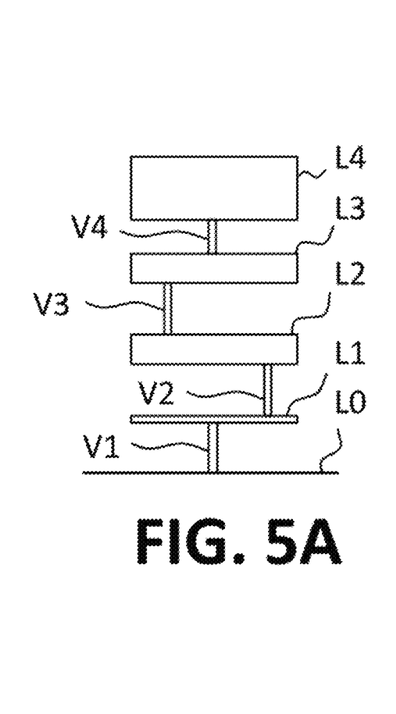
FIG. 5A illustrates a cross-sectional view of a general metal layer stack, according to example embodiments.
Figure 5B:
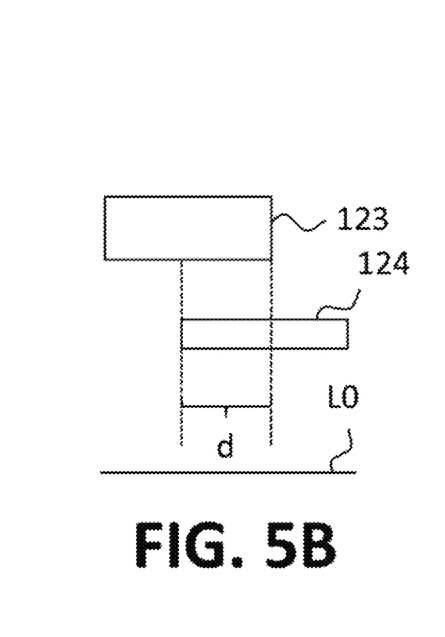
FIG. 5B illustrates a cross-sectional view of broadside coupled lines, according to example embodiments.

The metal layers are explained in more detail in the cross-sectional views of FIGS. 5A and 5B. FIG. 5A illustrates that a metal layer stack may comprises metal layers L0-L5 and vias V1-V4 to connect the various metal layers. FIG. 5B illustrates that first line segment 123 may be arranged in a higher metal layer than second line segment 124 and that these line segments may have a lateral offset d. Other embodiments, in which first line segment 123 is arranged in a lower metal layer than second line segment 124, are not excluded.

In FIG. 4A, second line segment 124 is connected to bondpad 121 using a via 125A that connects the higher metal layer of bondpad 121 to a lower lying metal layer. A first connecting segment 125 connects bondpad 121 to an end of second line segment 124, and a second connecting segment 126 connects an other end of second line segment 124 to non-grounded terminal 122 of the first capacitor segment. It is noted that second connecting segment 126 passes underneath bondpad 121.

In FIG. 4A, the current runs clockwise from bondpad 121 to non-grounded terminal 122 of the first capacitor. In FIG. 4B, this direction is reversed. Furthermore, in the embodiment shown in FIG. 4C, the connection to non-grounded terminal 122 is arranged farther away from bondpad 121. This affects the shape and size of line segments 125, 126.

Depending on the design, either one of unit cells 120A, 120B, 120C, 120D is preferred. By choosing between unit cells 120A, 120D on the one hand and unit cells 120B, 120C on the other hand, the sign of the coefficient of mutual induction can be reversed. It should be noted that other embodiments are possible that are a combination of unit cells 120A-120D. For example, a unit cell similar to that of FIG. 4D could be devised for unit cells 120B, 120C.

The present invention allows for a convenient, accurate, and well-reproducible determination of the amount of coupling between line segments 123, 124 to thereby mitigate the impact of the feedback capacitance on the stability of the power amplifier device. For example, the amount of coupling can be determined by selecting the appropriate length, width, and/or mutual position of line segments 123, 124.

Figure 5C:
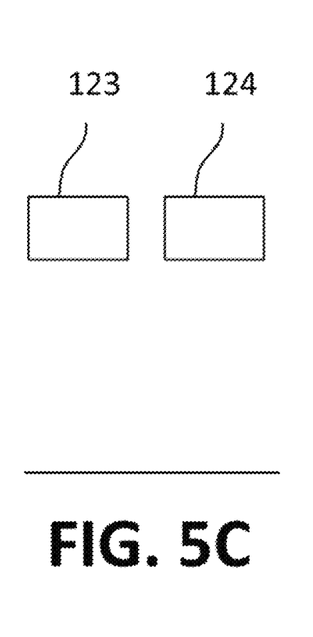
FIG. 5C illustrates a cross-sectional view of edge coupled lines, according to example embodiments.

FIG. 5C illustrates that instead of using broadside coupled lines, as illustrated in FIG. 5B, edge coupled lines may also be used. However, the applicability of this type of coupled lines may be limited due to size restrictions.

Figure 6:
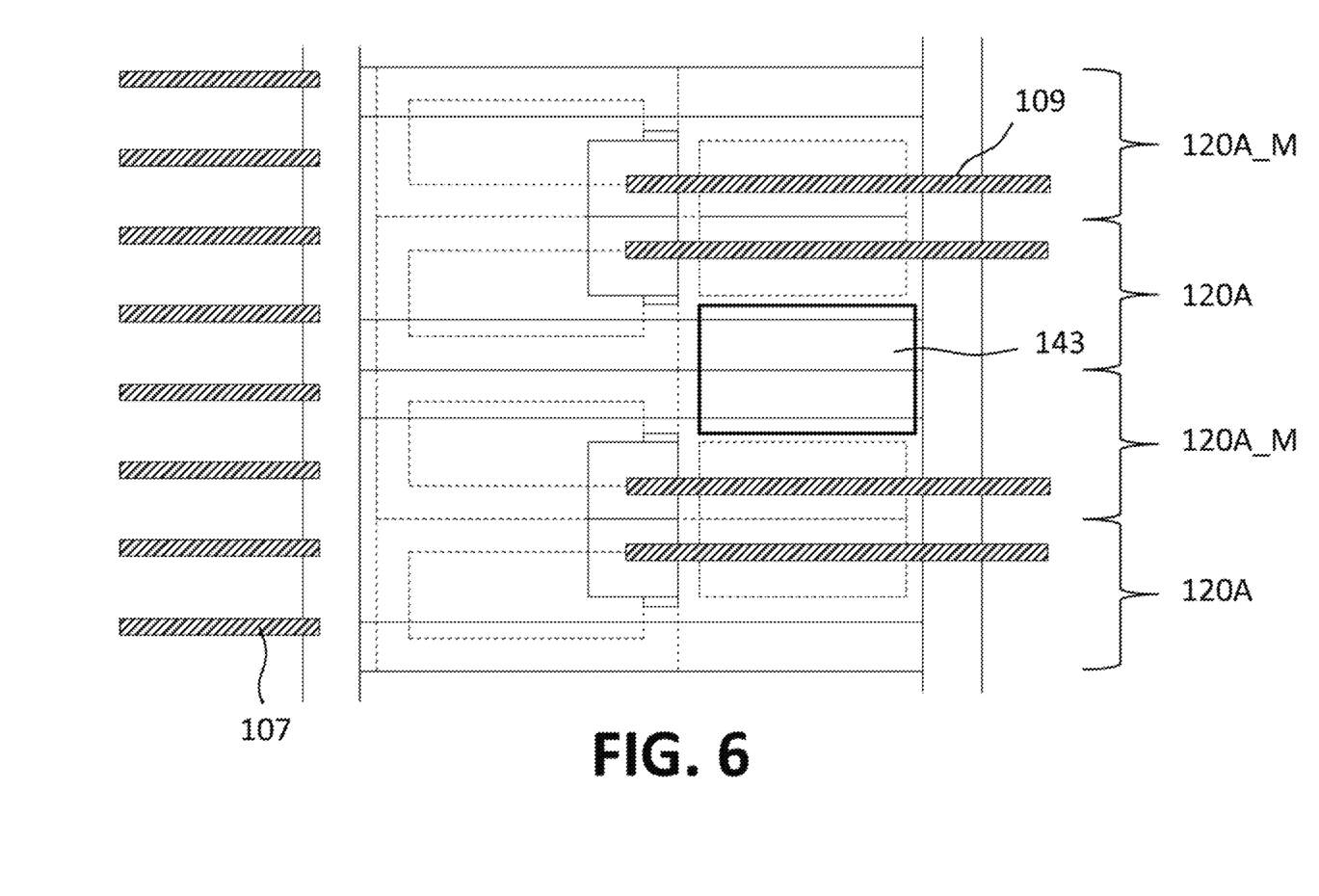
FIG. 6 illustrates the distributive arrangement of unit cells of the power amplifier device of FIG. 3, according to example embodiments.

FIG. 6 illustrates a top view of a part of semiconductor die 102 of power amplifier device 100. In this figure, it can be seen that a plurality of unit cells 120A are used in combination with a plurality of unit cells 120A_M, wherein each unit cell 120A_M is a mirrored version of unit cell 120A. Unit cells 120A_M and unit cells 120A are arranged alternately. Bondpads 121, non-grounded terminal 122 and second connecting segment 126 of adjacent unit cells 120A, 120B abut each other, as well as first line segments 123 and second line segments 124.

A part of first line segment 123 does not couple with second line segment 124. This latter part extends alongside non-grounded terminal 122 towards connecting bar 132. This part may be covered by a shield plate 143 as illustrated in FIG. 6, which shield plate is arranged in a higher metal layer than first line segment 123 and which shield plate may be grounded. Additionally or alternatively, a further shield plate (not shown) may be arranged in a lower metal layer than first line segment 123. Such further shield plate may be used to control the RF return currents and may be grounded.

In the above, the present invention has been explained using detailed embodiments thereof. However, the present invention is not limited to these embodiments and various modifications are possible without deviating from the scope of the present invention which is defined by the appended claims.

What is claimed is:

1. A power amplifier device, comprising:
   a semiconductor die having a first input terminal and a first output terminal;
   a power transistor integrated on the semiconductor die and comprising a second input terminal and a second output terminal arranged at an input side and output side of the power transistor, respectively, wherein the power transistor has an output capacitance;
   a shunt network comprising a plurality of first bondwires arranged in series with a first capacitor, wherein the first capacitor is arranged near the input side of the power transistor, wherein one end of the shunt network is coupled to the second output terminal via the plurality of first bondwires, wherein another end of the shunt network is, at least during use, electrically grounded, and wherein an inductance associated with the plurality of first bondwires and a capacitance associated with the first capacitor is such that at or close to an operational frequency of the power amplifier device the shunt network resonates with the output capacitance; and
   a pair of coupled lines formed on the semiconductor die, wherein a first line of the pair of coupled lines is connected in series between the first input terminal and the second input terminal, and wherein a second line of the pair of coupled lines is incorporated in the shunt network in series with the first plurality of bondwires and the first capacitor.

2. The power amplifier device according to claim 1, wherein the shunt network is arranged on the semiconductor die.

3. The power amplifier device according to claim 1, wherein:
the semiconductor die comprises a metal layer stack comprising a plurality of metal layers;
the pair of coupled lines is formed on different metal layers in the metal layer stack, the pair of coupled lines having at least a partial lateral overlap; or
the pair of coupled lines is formed using laterally adjacent lines.

4. The power amplifier device according to claim 1, wherein the first capacitor comprises a first and second terminal,
wherein the first line of the pair of coupled lines comprises a first end connected to the first input terminal and a second end connected to the second input terminal, and
wherein:
the second line of the pair of coupled lines comprises a third end connected to another end of the plurality of first bondwires and a fourth end connected to the first terminal of the first capacitor, the second terminal of the first capacitor being electrically grounded at least during use; or
the second line of the pair of coupled lines comprises a third end connected to the second terminal of the first capacitor and a fourth end that is electrically grounded at least during use, the first terminal of the first capacitor being connected to the other end of the first plurality of bondwires.

5. The power amplifier device according to claim 4, wherein the first end is arranged closer to the third end than to the fourth end, and wherein the second is arranged closer to the fourth end than to the third end.

6. The power amplifier device according to claim 1, wherein the first and second lines of the pair of coupled lines are formed by respective straight line segments.

7. The power amplifier device according to claim 1, wherein the pair of coupled lines and the first capacitor are implemented in a distributed manner.

8. The power amplifier device according to claim 7, wherein the semiconductor die comprises a plurality of first unit cells, each first unit cell comprising:
a first capacitor segment;
a first line segment extending between a first line segment input and a first line segment output;
a bondpad coupled to the second output terminal using one or more first bondwires; and
a second line segment of which a part forms a respective pair of coupled line segments with at least a part of the first line segment,
wherein the first capacitor is formed by the plurality of first capacitor segments,
wherein the pair of coupled lines is formed by the plurality of pairs of coupled line segments, and
wherein each first unit cell further comprises:
a first connecting segment connecting the bondpad to an end of the second line segment and a second connecting segment connecting another end of the second line segment to the first capacitor segment; or
a first connecting segment connecting an end of the second line segment to the first capacitor segment and a second connecting segment connecting another end of the second line segment to ground at least during use, wherein the first capacitor segment is arranged in series between the second line segment and the bondpad.

9. The power amplifier device according to claim 8, wherein the semiconductor die further comprises a first connecting bar to which the first line segment inputs are connected, and wherein the first connecting bar is connected to or at least partially forms the first input terminal.

10. The power amplifier device according to claim 8, wherein the semiconductor die further comprises a second connecting bar to which the first line segment outputs are connected, and wherein the second connecting bar is connected to or at least partially forms the second input terminal.

11. The power amplifier device according to claim 10, wherein the first capacitor segments are arranged in a space between the bondpad and the second connecting bar.

12. The power amplifier device according to claim 11, wherein a part of each first line segment that does not couple with a respective second line segment is shielded.

13. The power amplifier device according to claim 8, wherein the semiconductor die further comprises a plurality of second unit cells.

14. The power amplifier device according to claim 13, wherein the first and second unit cells are alternately arranged such that either the first line segments of adjacent first and second unit cells abut each other or such that the bondpad and/or the first or second connecting elements of adjacent first and second unit cells abut each other.

15. The power amplifier device according to claim 1, wherein the semiconductor die further comprises:
a plurality of input fingers that are each coupled to the second input terminal; and
a plurality of output fingers that are each coupled to the second output terminal, wherein the second output terminal at least partially forms the first output terminal or is connected to the first output terminal through an impedance matching stage.

16. The power amplifier device according to claim 1, wherein the first output terminal and the first input terminal are each formed by a bondbar or by a plurality of bondpads.

17. The power amplifier device according to claim 1, further comprising a power amplifier output connected to the first output terminal using a plurality of second bondwires.

18. The power amplifier device according to claim 17, further comprising a power amplifier input that is connected to the first input terminal directly using a plurality of third bondwires or that is connected to the first input terminal through one or more impedance matching stages of which a last impedance matching stage is connected to the first input terminal using a plurality of third bondwires.

19. The power amplifier device according to claim 1, further comprising:
a conductive substrate;
one or more input leads; and
one or more output leads that are separated from the conductive substrate, wherein the semiconductor die is mounted on the conductive substrate, wherein at least one input lead forms the power amplifier input, and wherein at least one output lead forms the power amplifier output.

20. A semiconductor die having a first input terminal and a first output terminal, the semiconductor die further comprising:

a power transistor integrated on the semiconductor die and comprising a second input terminal and a second output terminal arranged at an input side and output side of the power transistor, respectively, wherein the power transistor has an output capacitance;

a shunt network comprising a plurality of first bondwires arranged in series with a first capacitor, wherein the first capacitor is arranged near the input side of the power transistor, wherein one end of the shunt network is coupled to the second output terminal via the plurality of first bondwires, wherein another end of the shunt network is, at least during use, electrically grounded, and wherein an inductance associated with the plurality of first bondwires and a capacitance associated with the first capacitor is such that at or close to an operational frequency of the power transistor the shunt network resonates with the output capacitance; and a pair of coupled lines formed on the semiconductor die, wherein a first line of the pair of coupled lines is connected in series between the first input terminal and the second input terminal, and wherein a second line of the pair of coupled lines is incorporated in the shunt network in series with the first plurality of bondwires and the first capacitor.

* * * * *